United States Patent
Schulze et al.

(12) 
(10) Patent No.: US 6,396,160 B1
(45) Date of Patent: May 28, 2002

(54) FILL STRATEGIES IN THE OPTICAL KERF

(75) Inventors: Steffen Schulze, Wappingers Falls; Kathryn H. Varian, Hopewell Junction; Timothy Wiltshire, Fishkill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/395,420

(22) Filed: Sep. 14, 1999

(51) Int. Cl.[7] ............................................. H01L 23/544
(52) U.S. Cl. ...................................................... 257/797
(58) Field of Search ........................... 257/48, 619, 620, 257/797

(56) References Cited

U.S. PATENT DOCUMENTS 5,681,423 A 10/1997 Sandhu et al.
5,786,260 A 7/1998 Jang et al. .................. 438/401
5,789,302 A 8/1998 Mitwalsky et al.

*Primary Examiner*—Nathan Flynn
*Assistant Examiner*—Leonardo Andujar
(74) *Attorney, Agent, or Firm*—Connolly Bove Lodge & Hutz LLP; Steven A. Capella

(57) ABSTRACT

Various fill strategies in the optical kerf are provided. A semiconductor wafer is divided into chip areas by strips of optical kerf regions. The optical kerf regions contain alignment marks used in the lithography processes. Partial fill patterns are provided in the optical kerf regions so that the area factor of the kerf region is similar to that of the chip areas. This results in full planarization by chemical mechanical polishing becoming feasible. Additionally, the fill is patterned so the alignment marks may be read accurately.

20 Claims, 3 Drawing Sheets

FILL STRATEGIES IN THE OPTICAL KERF

FIELD OF THE INVENTION

The present invention relates to fill strategies in the optical kerf, and more particularly, to a fill pattern in the optical kerf which can be used at all levels where planarization is required and which allows the measurement and alignment marks in the optical kerf to be distinguished from the fill background.

BACKGROUND OF THE INVENTION

The use of fill is known to level loads for etching, chemical mechanical polishing (CMP) or other technological processes used in the formation of integrated circuits. However, in the optical kerf, a CMP process for planarization is a multi-step, multi-process sequence which is quite complicated. The optical kerf is a strip between chips or a frame around chips on a wafer. Measurement and alignment marks which contain the information necessary for photolithography and other processes carried out in chip manufacture are contained in the kerf. The marks need to be read with a high degree of accuracy and are very sensitive to process variations. As such, the marks should be disturbed as little as possible during the chip manufacturing process. Because of the sensitivity of the marks, the optical kerf usually either does not contain fill, or is filled with solid fill so the marks are not disturbed. In these ways, a solid background is provided for the marks so they may be read accurately.

It should be noted that the marks are provided to correct the relative position of the wafer to be exposed and the mask carrying the information for the exposure. The alignment marks on the wafer are read by scanning with an illuminated slit. Scanning occurs on edges of the mark and is directional. Light reflected or scattered by the alignment mark is gathered as the alignment signal. The relative position of the alignment tool and the mark is chosen to generate a maximum alignment signal. The scattering of the light is usually much stronger on an edge of the mark parallel to the path of the alignment tool. Any fill pattern implemented into the optical kerf should be chosen in such a way that it does not disturb the alignment signal by a significant amount. The field imaging alignment technique currently used relies on the contrast (resolution) of the mark to its background. A fill pattern which is below the resolution limit of the alignment tools appears to be gray and is not detected.

U.S. Pat. No. 5,766,260 to Jang et al. and U.S. Pat. No. 5,681,423 to Sandhu describe various methods of forming alignment marks and polishing techniques the kerf area. However, techniques are quite complicated. In order for full planarization by CMP to become feasible, the different areas of the wafer should contain similar area factors or pattern densities. This means that the pattern density of the product array, which includes the chip and comprises most of the wafer, should be matched by the pattern density of the optical kerf. In many products, the pattern density of the product array is between 25% and 50% solid area. Therefore, a goal for the kerf pattern density should be at most 50% solid area. Thus, the known methods of not providing fill in the optical kerf or filling the optical kerf solid with fill are insufficient.

Additionally, it is not possible to provide any additional empty space between the optical kerf and the product array to match the area densities. To achieve the required densities of the chips on the wafer, the space between chip areas needs to be kept as small as possible. However, measures should be taken in order to support polishing. Otherwise, non-uniformities extend from the optical kerf into the chip area. These non-uniformities may result in a degradation of performance in the chip.

Thus, there is a need for a fill strategy which can support full planarization by CMP while keeping the optical kerf at its present size. Additionally, the fill strategy should provide minimal interference with the measurement and alignment marks present in the optical kerf.

SUMMARY OF THE INVENTION

A fill pattern in the optical kerf region is provided. The optical kerf is partially filled with fill in a pattern which has little or no impact on the measurement and alignment marks provided in the optical kerf.

In one embodiment of the invention, the fill is formed as an alternating pattern of lines of fill and unfilled space. The lines may have a thickness which is below the resolution limit of an alignment tool used to read the marks.

In another embodiment of the present invention, the fill is provided in the optical kerf in a pattern that can be resolved by the alignment tool. However, the fill is present at such a low level that it does not contribute a significant amount to the alignment signal.

In a further embodiment of the present invention, the fill is incorporated in the optical kerf in areas outside a measurement region where the marks are scanned by the alignment tool.

BRIEF DESCRIPTION OF THE DRAWINGS

The present invention will now be further described in the following pages of specification when taken in conjunction with the attached drawings, in which.

DETAILED DESCRIPTION OF THE INVENTION

The present invention provides fill strategies in the optical kerf which take into consideration the implications of the fill on the alignment marks. A wafer on which semiconductor devices are formed has chip areas and optical kerf regions. The optical kerf regions are typically strips arranged between the chip areas or around single chips. The optical kerf regions are usually 50 to 250 micron wide, although other sizes are possible, and contain measurement and alignment marks which are necessary for carrying out further photolithography processes. In order to simplify the manufacture of semiconductor devices, it is desirable that CMP be carried out as a single step process. To accomplish this, the area factor of the chip should be similar to the area factor of the optical kerf. Since the chip area comprises most of the wafer, matching the area factor of the kerf with the area factor of the chip is the goal.

One approach which achieves this goal is partially removing fill from the very dense optical kerf region. However, care must be exercised when removing fill from the optical kerf region due to the immense complexity of the alignment and measurement marks that are present in the kerf region.

Therefore, the fill is removed so that a pattern of fill which remains does not significantly affect the alignment signal. Patterned fill refers to areas of fill separated by unfilled spaces. The present invention provides several strategies which reduce the area factor of the optical kerf without affecting the signals used to align and perform overlay in the critical lithography processes. This in turn allows full planarization by CMP and simplifies the manufacturing process. Which of these strategies is employed will depend upon the type of alignment and measurement marks being used, as well as the particular alignment tool.

A first strategy is providing a consistent fill background that the alignment tool does not resolve. The fill is preferably formed in the kerf region in a pattern which is below the resolution limit of the alignment tool. Typically, in the manufacture of semiconductor devices, the fill is formed in the kerf region, planarized, and the alignment and measurement marks are formed on top of the fill. The fill provides a background for the alignment marks when the marks are read by an alignment tool. Therefore, the fill should not interfere with the alignment signal read by the alignment tool. Thus, in the first strategy, the fill pattern should not be resolved or otherwise interfere with the signal read by the alignment tool.

Figure 1:
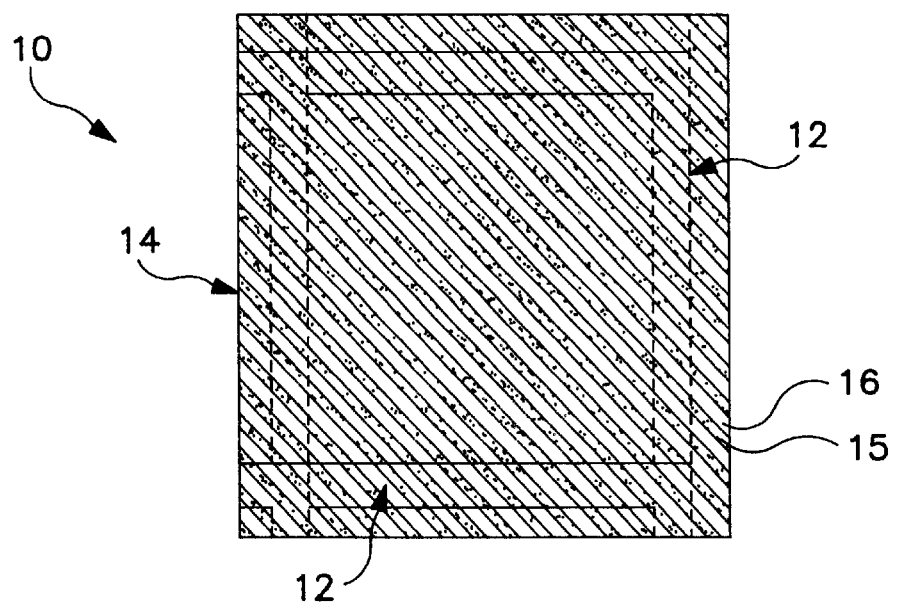
FIG. 1 illustrates a fill pattern in accordance with a first embodiment of the present invention.

An example of this first fill strategy is illustrated in FIG. 1. This strategy would be appropriate when the alignment marks are relatively large. FIG. 1 shows a portion of the kerf region 10 having alignment marks 12 and a fill pattern 14. The alignment marks shown in FIG. 1 are horizontal and vertical bars 12 which may be about 5 microns wide and 100 microns long. The horizontal and vertical bars 12 are arranged in an array in the kerf region 10. When the alignment tool scans the kerf region 10, it is scanning for the horizontal and vertical bars of the alignment marks 12. Thus, any fill pattern in the kerf region 10 which is smaller than the size of the alignment marks, and preferably below the resolution limit of the alignment tool, should not interfere with the alignment signal. The larger size of the alignment marks will be easily distinguished from the fill pattern. Thus, only fill which meets these requirements should be provided in the kerf region.

Here, the fill is formed in a pattern 14. The pattern 14 comprises alternating lines of fill 15 separated by unfilled spaces 16. The width of the lines of fill 15 and unfilled spaces 16 are preferably below the resolution limit of the alignment tool and may be, for example, 0.5 microns. Additionally, as the alignment tool typically moves in a horizontal or vertical direction across the optical kerf to detect the horizontal and vertical alignment marks, the fill pattern is preferably arranged at an oblique angle relative to the alignment marks. The edges of the angled fill pattern will therefore not be parallel to the path of the alignment tool. Thus, any signal from the fill pattern will be minimized. The fill pattern 14 shown in FIG. 1 is arranged at a 45° angle relative to the horizontal and vertical bars 12. A fill pattern arranged as described above will appear as a gray or a solid background to the alignment tool and will not affect the alignment signal.

In some cases, the alignment pattern may have a small size. The first strategy may not be preferred in these cases as the small alignment pattern needs to be resolved by the alignment tool. Forming a fill pattern below the resolution limit of the alignment tool may then prove to be complicated. In these cases, a low level fill may be provided in the kerf region. The low level fill can be resolved by the alignment tool, but doesn't contribute a significant amount to the measured signal. This may be accomplished by providing a fill pattern without edges. As described above, the alignment tool detects scattered light and the signal is strongest at edges of the pattern or mark. By providing a low level fill, the alignment tool receives a stronger signal from the alignment mark compared with the fill. Thus, an acceptable signal to noise ration is achieved and accuracy is not compromised.

Figure 2:
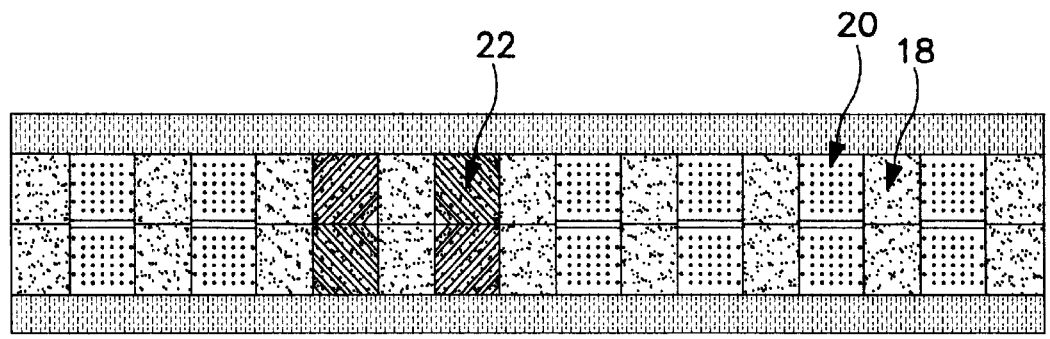
FIG. 2 illustrates a fill pattern in accordance with a second embodiment of the present invention.
Figure 2A:
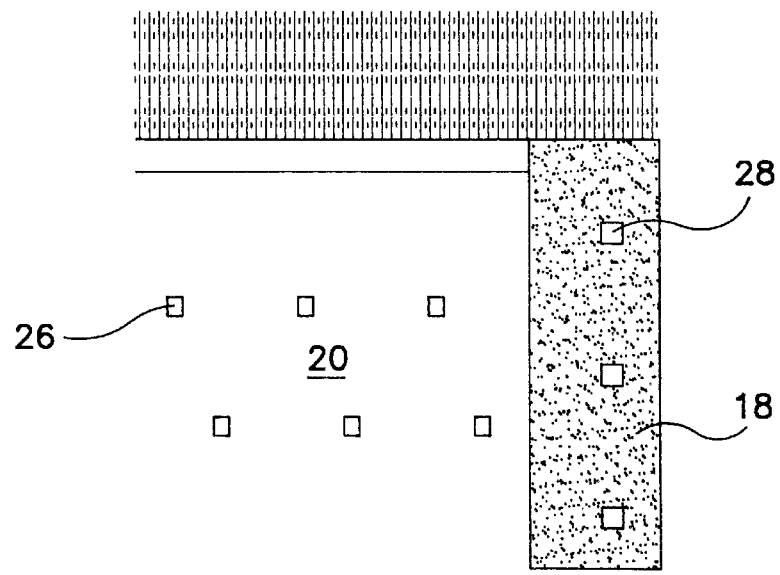
FIG. 2a is a magnified view of FIG. 2.

An example of the second strategy is shown in FIGS. 2 and 2a. FIG. 2 illustrates a Micrascan III track with dotted fill in the marks. A pattern of alternating areas of solid fill 18 and unfilled zones 20 is arranged in the kerf region. Alignment marks 22 are arranged in selected ones of the unfilled zones 20. In the example shown, the alignment marks 22 are lines arranged at a 45° angle. The remaining unfilled zones 20 are usually devoid of fill so the alignment tool does not make any erroneous readings. However, in this instance, dotted fill 26 is provided in the unfilled zones 20 which do not contain alignment marks.

FIG. 2a shows a magnified image of FIG. 2. To support polishing, dots 26 of fill are provided in the unfilled zones 20. Additionally, if necessary, holes 28 may also be provided in the area of solid fill 18 to further reduce ashing. As shown in FIG. 2a, the dots 26 have relatively small edges compared with the alignment marks 22. When the alignment tool passes over the alignment mark 22 and the unfilled zones 20 containing dots 26, the edges of the alignment marks 22 will provide a much stronger signal compared to the dots 26. Thus, the signal to noise ratio of the alignment signal will be sufficiently high so that an accurate reading of the alignment marks is possible. By providing the dots of fill in the unfilled zones, planarization by CMP can be supported.

In certain situations, no disturbance of the alignment signal can be accepted. In the past, it would have been impossible to form any fill pattern in the kerf region. However, by analyzing how the measurement and alignment marks are utilized, it is possible to identify areas of the marks which are not used for generating the alignment signals. The fill may then be patterned in these areas so that measurement and unfilled zone requirements in the kerf region are met.

Figure 3:
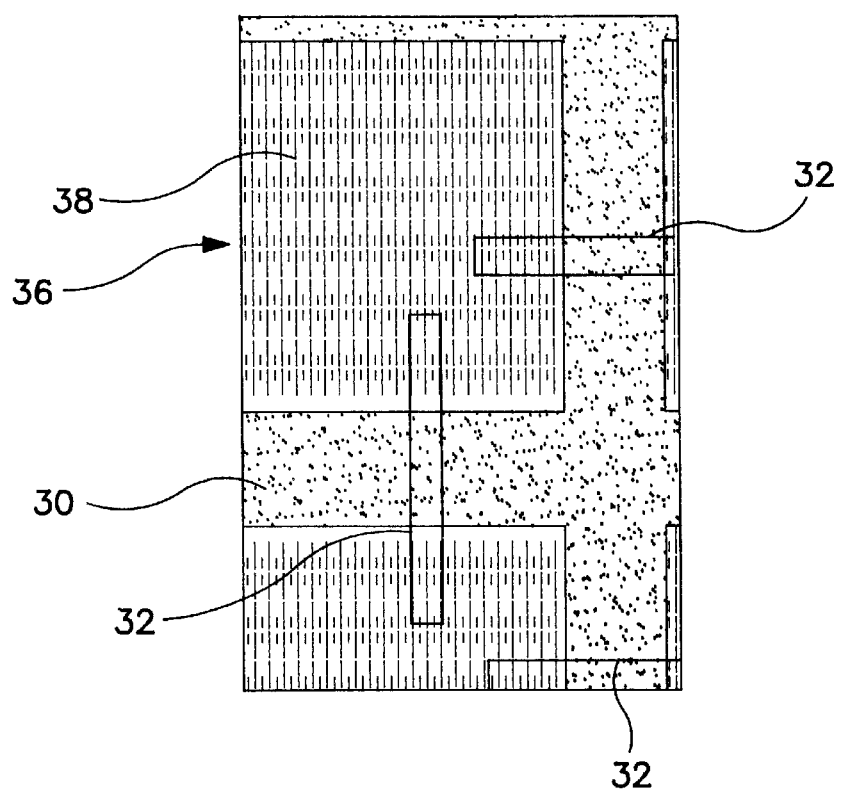
FIG. 3 illustrates a fill pattern in accordance with a third embodiment of the present invention.

An example of a fill strategy according to a third embodiment of the invention is shown in FIG. 3. First, it is determined how the alignment marks are being utilized. This may be done by analyzing the path the alignment tool takes as it scans the optical kerf. The alignment marks and fill in these areas, measurement zones, are then left undisturbed. In the example shown, the alignment tool moves in horizontal and vertical directions across the optical kerf to detect the horizontal and vertical alignment marks 32. Therefore, the fill is left undisturbed in these areas resulting in a pattern of solid fill 30 having a substantially cross-shape. The alignment marks 32 in the measurement zones are arranged on top of the solid fill 30. The window for scanning of the alignment tool is preferably smaller than the area of the solid fill 30 to ensure that the alignment marks 32 are read accurately. Thus, the cross 30 provides a solid background for the alignment marks 32 in areas where the marks are read by the alignment tool.

It is not as critical for the parts of the alignment marks which fall outside the measurement zone to have a solid background. Therefore, those areas 36 of the kerf region which lie outside of the measurement zones may contain patterned fill. As shown in FIG. 3, these areas 36 contain patterned fill 38 comprising a plurality of horizontal bars of fill separated by unfilled areas. Portions of the alignment marks 32 outside of the measurement zones may have the patterned fill 38 as a background as these parts of the marks 32 are not read by the alignment tool. Of course, other types of patterned fill may be used depending upon the circumstances and relevant area factors. Also, cross 30 may be devoid of fill to provide an appropriate background.

Accordingly, several fill strategies for the optical kerf have been provided. Fill is taken out of the very dense optical kerf region to obtain a similar area factor between the optical kerf and the chip areas. This in turn, enables full planarization by CMP. Additionally, the fill is patterned in a manner so that the signals used to align and perform overlay in lithography processes are not adversely affected.

While preferred embodiments of the invention have been described above, since variations in the invention will be apparent to those skilled in the art, the invention should not be construed as limited to the specific embodiments described above. For example, based upon the type of alignment marks used and the area factors, the specific type of fill pattern may vary from that described above.

What is claimed is:

1. A semiconductor device comprising:
   a substrate;
   at least one chip area provided on the substrate;
   kerf areas adjacent the chip area;
   a fill pattern covering the entire kerf area;
   marks, readable by an alignment tool, arranged in the kerf area, wherein the fill pattern is distinguishable from the marks by the alignment tool.

2. The device of claim 1 wherein the fill pattern comprises alternating lines of fill defining unfilled space therebetween.

3. The device of claim 1 wherein the fill pattern is consistent.

4. The device of claim 2 wherein the marks are rectangular shaped.

5. The device of claim 2 wherein the lines of fill are arranged at an angle relative to the marks.

6. The device of claim 4 wherein the lines of fill and unfilled space are of a size below the resolution limit of the alignment tool.

7. The device of claim 4 wherein the rectangular shape is about 5 microns wide and about 100 microns long.

8. The device of claim 6 wherein the lines of fill and unfilled space are about 0.5 microns wide.

9. A semiconductor device comprising:
   a wafer having chip areas and kerf areas adjacent the chip areas;
   marks arranged in the kerf areas;
   patterned fill arranged in the kerf area, the kerf area having an area factor which is substantially equal to an area factor of the chip areas.

10. The device of claim 9 wherein the patterned fill comprises areas of solid fill and unfilled zones.

11. The device of claim 9 wherein the patterned fill is a series of alternating lines of fill.

12. The device of claim 9 wherein the patterned fill and the mark have edges which are not parallel to each other.

13. The device of claim 9 wherein the patterned fill is arranged outside of a measurement zone.

14. The device of claim 10 wherein the lines of fill are a width which is below the resolution limit of an alignment tool.

15. A semiconductor device comprising:
   a substrate;
   at least one chip area provided on the substrate;
   kerf areas adjacent the chip area wherein an area factor of the chip areas is about the same as an area factor of the kerf regions;
   a fill pattern covering at least a portion of the kerf area;
   marks, readable by an alignment tool, arranged in the kerf area, wherein the fill pattern is distinguishable from the marks by the alignment tool.

16. The device of claim 15 wherein the low level fill comprises dots of fill.

17. A semiconductor device comprising:
   a substrate;
   at least one chip area provided on the substrate;
   kerf areas adjacent the chip area;
   a fill pattern covering at least a portion of the kerf area wherein the fill pattern comprises complete areas of solid fill next to unfilled zones, the unfilled zones containing a low level fill which does not affect a measurement signal;
   marks, readable by an alignment tool, arranged in the kerf area, wherein the fill pattern is distinguishable from the marks by the alignment tool.

18. The device of claim 17 wherein the marks are arranged in selected ones of the unfilled zones.

19. A semiconductor device comprising:
   a substrate;
   at least one chip area provided on the substrate;
   kerf areas adjacent the chip area;
   a fill pattern covering at least a portion of the kerf area;
   marks, readable by an alignment tool wherein the alignment tool crosses a measurement zone of the kerf region, a solid fill being arranged at least in the measurement zone and the fill pattern being arranged in remaining portion of the kerf region, arranged in the kerf area, wherein the fill pattern is distinguishable from the marks by the alignment tool.

20. The device of claim 19 wherein parts of the marks in the measurement zones are arranged on the solid fill and remaining areas of the marks are arranged on the fill pattern.

* * * * *